(12) United States Patent
Jeong

(10) Patent No.: US 11,605,640 B1
(45) Date of Patent: Mar. 14, 2023

(54) STORAGE DEVICE AND MANUFACTURING METHOD THEREOF

(71) Applicant: WUHAN XINXIN SEMICONDUCTOR MANUFACTURING CO., LTD., Hubei (CN)

(72) Inventor: Jongbae Jeong, Hubei (CN)

(73) Assignee: WUHAN XINXIN SEMICONDUCTOR MANUFACTURING CO., LTD., Hubei (CN)

( * ) Notice: Subject to any disclaimer, the term of this patent is extended or adjusted under 35 U.S.C. 154(b) by 0 days.

(21) Appl. No.: 17/542,427

(22) Filed: Dec. 5, 2021

(30) Foreign Application Priority Data

Sep. 30, 2021 (CN) .......................... 202111160792.5

(51) Int. Cl.
| | | |
|---|---|---|
| *G11C 8/10* | (2006.01) | |
| *H01L 27/11519* | (2017.01) | |
| *H01L 27/11565* | (2017.01) | |
| *G11C 8/14* | (2006.01) | |
| *G11C 8/08* | (2006.01) | |
| *G11C 7/18* | (2006.01) | |

(52) U.S. Cl.
CPC .......... *H01L 27/11519* (2013.01); *G11C 7/18* (2013.01); *G11C 8/08* (2013.01); *G11C 8/10* (2013.01); *G11C 8/14* (2013.01); *H01L 27/11565* (2013.01)

(58) Field of Classification Search
CPC .... G11C 7/18; G11C 8/08; G11C 8/10; G11C 8/14; H01L 27/11565; H01L 27/11519
See application file for complete search history.

(56) References Cited

U.S. PATENT DOCUMENTS

| | | | | |
|---|---|---|---|---|
| 8,526,251 B2* | 9/2013 | Park | ...................... | G11C 7/222 |
| | | | | 365/194 |
| 8,542,546 B2* | 9/2013 | Matsui | ................... | G11C 29/48 |
| | | | | 365/201 |
| 9,368,167 B2* | 6/2016 | Park | ...................... | G11C 29/022 |

(Continued)

FOREIGN PATENT DOCUMENTS

| | | |
|---|---|---|
| CN | 212277194 U | 1/2021 |
| TW | 201639118 A | 11/2016 |

(Continued)

OTHER PUBLICATIONS

Taiwan Office Action issued in corresponding Patent Application No. 110144909 dated Oct. 20, 2022, pp. 1-13.

*Primary Examiner* — Khamdan N. Alrobaie
(74) *Attorney, Agent, or Firm* — Mark M. Friedman

(57) ABSTRACT

A storage device and a manufacturing method thereof are provided. The storage device includes a first chip and a second chip. The second chip is stacked on the first chip in a third direction. The first chip includes a storage array, and the storage array includes at least one storage block. An occupied area after the first chip and the second chip are stacked can be reduced by constructing a first local bit line decoder block, a second local bit line decoder block, a first word line decoder block, and a second local bit line decoder block in a top view projection area, thereby reducing plane occupied space of the storage device. This is beneficial for minimizing the size of the storage device.

20 Claims, 5 Drawing Sheets

(56) References Cited

U.S. PATENT DOCUMENTS

| | | |
|---|---|---|
| 10,262,972 B2 | 4/2019 | Lee et al. |
| 10,804,209 B2 | 10/2020 | Kang |
| 11,227,648 B2 | 1/2022 | Bedeschi |
| 2009/0129136 A1* | 5/2009 | Takemura ......... H01L 27/10814 |
| | | 365/230.03 |
| 2016/0322376 A1 | 11/2016 | Lee |
| 2021/0074342 A1* | 3/2021 | Tsuji .................... G11C 7/1006 |
| 2021/0151465 A1 | 5/2021 | Tagami et al. |
| 2022/0101899 A1 | 3/2022 | Dodge et al. |

FOREIGN PATENT DOCUMENTS

| | | |
|---|---|---|
| TW | 201903765 A | 1/2019 |
| TW | 201921631 A | 6/2019 |
| TW | 709234 B | 11/2020 |
| TW | 732985 B | 7/2021 |

* cited by examiner

STORAGE DEVICE AND MANUFACTURING METHOD THEREOF

TECHNICAL FIELD

The present disclosure relates to the technology field of storage, and more particularly to a storage device and a manufacturing method thereof.

BACKGROUND

As shown in FIG. 1, a storage device in a conventional technical solution includes a plurality of storage arrays 510, a plurality of local bit line decoders 520, a plurality of word line decoders 540, a plurality of global bit line decoders 530, and a peripheral circuit 550. Structure areas of the storage arrays 510, structure areas of the local bit line decoders 520, structure areas of the word line decoders 540, structure areas of the global bit line decoders 530, and a structure area of the peripheral circuit 550 do not overlapped with each other. For example, each of the structure areas of the local bit line decoders 520 is located at one side of a corresponding one of the structure areas of the storage arrays 510, each of the word line decoders 540 is located at one side of a corresponding one of the structure areas of the word line decoders 540 and/or at another side of a corresponding one of the structure areas of the storage arrays 510, and each of the structure areas of the global bit line decoders 530 is located between a corresponding one of the structure areas of the local bit line decoders 520 and the structure area of the peripheral circuit area 550.

Specifically, as shown in FIG. 2, a storage block 511 in each of the storage arrays 510 is electrically connected to a corresponding one of the local bit line decoders 520 through a plurality of first connection wires 531, and the storage block 511 is electrically connected to a corresponding one of the word line decoders 540 through a plurality of second connection wires 532. The corresponding one of the local bit line decoders 520 is located at one side of the storage block 511, and the corresponding one of the word line decoders 540 is located at another side of the storage block 511. Similarly, a structure area of the storage block 511, a structure area of the corresponding one of the local bit line decoders 520, and a structure area of the corresponding one of the word line decoders 540 in FIG. 2 do not overlap with each other.

Accordingly, the storage device in the above-mentioned conventional technical solution needs to occupy a large space to integrate the structures of the above-mentioned parts, and this is not beneficial for minimizing the size of the storage device.

It should be noted that the above-mentioned introduction of the background technology is only to facilitate a clear and complete understanding of the technical solutions of the present disclosure. Therefore, it cannot be considered that the above-mentioned related technical solutions are known to those skilled in the art just because they appear in the background technology of the present disclosure.

SUMMARY OF DISCLOSURE

The present disclosure provides a storage device and a manufacturing method thereof alleviate the technical problem that the storage device needs to occupy large space.

In a first aspect, the present disclosure provides a storage device including a first chip and a second chip. The second chip is stacked on the first chip in a third direction. The first chip includes a storage array, the storage array includes at least one storage block, and the storage block includes a plurality of word lines extending in a first direction and a plurality of bit lines extending in a second direction. The second chip includes a first local bit line decoder, a second local bit line decoder, a first word line decoder, and a second word line decoder which are electrically connected to the storage block. The second chip has a top view projection area corresponding to the storage block. The first local bit line decoder, the second local bit line decoder, the first word line decoder, and the second word line decoder respectively constitute, in the top view projection area, a first local bit line decoder block, a second local bit line decoder block, a first word line decoder block, and a second word line decoder block which do not overlap with each other.

In some embodiments, in the first direction, a sum of a first length of the first local bit line decoder block and a second length of the second local bit line decoder block is smaller than or equal to a length of the top view projection area, and projections of the first local bit line decoder block and the second local bit line decoder block do not overlap with each other in the second direction. In the second direction, a sum of a third length of the first word line decoder block and a fourth length of the second word line decoder block is smaller than or equal to a width of the top view projection area, and projections of the first word line decoder block and the second word line decoder block do not overlap with each other in the first direction.

In some embodiments, the first length is different from the second length, and the third length is different from the fourth length.

In some embodiments, a part of the bit lines are electrically connected to the first local bit line decoder, and the other part of the bit lines are electrically connected to the second local bit line decoder; and a part of the word lines are electrically connected to a first word line decoder, and the other part of the word lines are electrically connected to a second word line decoder.

In some embodiments, in the first direction, the first word line decoder block is located between a first edge of the top view projection area extending in the second direction and the first local bit line decoder block, and a width of the first local bit line decoder block in the second direction is smaller than the third length of the first word line decoder block in the second direction. In the second direction, the first word line decoder block is located between a second edge of the top view projection area extending in the first direction and the second local bit line decoder block, and the second length of the second local bit line decoder block in the first direction is larger than a width of the first word line decoder block in the first direction.

In some embodiments, in the first direction, the second word line decoder block is located between a third edge of the top view projection area extending in the second direction and the second local bit line decoder block, and a width of the second local bit line decoder block in the second direction is smaller than the fourth length of the second word line decoder block in the second direction. In the second direction, the second word line decoder block is located between a fourth edge of the top view projection area extending in the first direction and the first local bit line decoder block, and the first length of the first local bit line decoder block in the first direction is larger than a width of the second word line decoder block in the first direction.

In some embodiments, each of the first local bit line decoder and the second local bit line decoder has a plurality of first transmission terminals, and each of the first transmission terminals is electrically connected to one of the bit lines through a first silicon via or a pair of first bonding pads.

In some embodiments, each of the first word line decoder and the second word line decoder has a plurality of second transmission terminals, and each of the second transmission terminals is electrically connected to one of the word lines through a second silicon via or a pair of second bonding pads.

In some embodiments, the first chip includes a first bonding layer, and the first bonding layer includes at least one first bonding pad and/or at least one second bonding pad. The second chip includes a second bonding layer, and the second bonding layer includes at least one first bonding pad and/or at least one second bonding pad. The first bonding pad located on the first bonding layer is bonded to the first bonding pad located on the second bonding layer, and/or, the second bonding pad located on the first bonding layer is bonded to the second bonding pad located on the second bonding layer.

In some embodiments, the top view projection area is a rectangle. The first local bit line decoder block is located at one of a first right angle of the top view projection area and a third right angle of the top view projection area, and the second local bit line decoder block is located at the other one of the first right angle of the top view projection area and the third right angle of the top view projection area. The first word line decoder block is located at one of a second right angle of the top view projection area and a fourth right angle of the top view projection area, and the second word line decoder area is located at the other one of the second right angle of the top view projection area and the fourth right angle of the top view projection area. Alternatively, the first local bit line decoder block is located at one of the second right angle of the top view projection area and the fourth right angle of the top view projection area, and the second local bit line decoder block is located at the other one of the second right angle of the top view projection area and the fourth right angle of the top view projection area. The first word line decoder block is located at one of the first right angle of the top view projection area and the third right angle of the top view projection area, and the second word line decoder area is located at the other one of the first right angle of the top view projection area and the third right angle of the top view projection area. The first right angle and the third right angle are respectively located at two sides in one diagonal line of the top view projection area, and the second right angle and the fourth right angle are respectively located at two sides in the other diagonal line of the top view projection area.

In some embodiments, in the first direction, the first word line decoder block is located between a left side of the second local bit line decoder block and a left side of the first local bit line decoder block. In the first direction, the second word line decoder block is located between a right side of the first local bit line decoder block and a right side of the second local bit line decoder block.

In some embodiments, in the second direction, the first local bit line decoder block is located between an upper side of the first word line decoder block and an upper side of the second word line decoder block. In the second direction, the second local bit line decoder block is located between a lower side of the second word line decoder block and a lower side of the first word line decoder block.

In some embodiments, in the first direction, a length of the first local bit line decoder block and a length of the second local bit line decoder block are smaller than or equal to a length of the top view projection area. In the second direction, the first word line decoder block is located between the first local bit line decoder block and the second local bit line decoder block, and the second word line decoder block is located between the first local bit line decoder block and the second local bit line decoder block.

In some embodiments, in the second direction, a length of the first word line decoder block and a length of the second word line decoder block are smaller than or equal to a width of the top view projection. In the first direction, the first local bit line decoder block is located between the first word line decoder block and the second word line decoder block, and the second local bit line decoder block is located between the first word line decoder block and the second word line decoder block.

In a second aspect, the present disclosure provides a manufacturing method of a storage device including: configuring a storage array on a first chip, wherein the storage array includes at least one storage block, and the storage block includes a plurality of word lines extending in a first direction and a plurality of bit lines extending in a second direction; configuring a first local bit line decoder, a second local bit line decoder, a first word line decoder, and a second word line decoder on a second chip, wherein the second chip has a top view projection area corresponding to the storage block, the first local bit line decoder, the second local bit line decoder, the first word line decoder, and the second word line decoder are electrically connected to the storage block, and the first local bit line decoder, the second local bit line decoder, the first word line decoder, and the second word line decoder respectively constitute, in the top view projection area, a first local bit line decoder block, a second local bit line decoder block, a first word line decoder block, and a second word line decoder block which do not overlap with each other; and stacking the second chip on the first chip in a third direction.

In some embodiments, the manufacturing method further includes: in the first direction, configuring a sum of a first length of the first local bit line decoder block and a second length of the second local bit line decoder block to be smaller than or equal to a length of the top view projection area, wherein projections of the first local bit line decoder block and the second local bit line decoder block do not overlap with each other in the second direction; and in the second direction, configuring a sum of a third length of the first word line decoder block and a fourth length of the second word line decoder block to be smaller than or equal to a width of the top view projection area, wherein projections of the first word line decoder block and the second word line decoder block do not overlap with each other in the first direction.

In some embodiments, the manufacturing method further includes: electrically connecting a part of the bit lines with the first local bit line decoder; electrically connecting the other part of the bit lines with the second local bit line decoder; electrically connecting a part of the word lines with the first word line decoder; and electrically connecting the other part of the word lines with the second word line decoder.

In some embodiments, the manufacturing method further includes: configuring a first bonding layer on the first chip; configuring a second bonding layer on the second chip; and stacking the second chip on the first chip, and forming a bonding structure through the first bonding layer and the second bonding layer to electrically connect the first chip with the second chip.

In the storage device and the manufacturing method thereof provided by the present disclosure, an occupied area after the first chip and the second chip are stacked can be reduced by constructing a first local bit line decoder block, a second local bit line decoder block, a first word line decoder block, and a second local bit line decoder block in a top view projection area, thereby reducing plane occupied space of the storage device. This is beneficial for minimizing the size of the storage device.

Furthermore, in the first direction, the sum of the first length of the first local bit line decoder block and the second length of the second local bit line decoder block is smaller than or equal to the length of the top view projection area, and the projections of the first local bit line decoder block and the second local bit line decoder block do not overlap with each other in the second direction. In the second direction, the sum of the third length of the first word line decoder block and the fourth length of the second word line decoder block is smaller than or equal to the width of the top view projection area, and the projections of the first word line decoder block and the second word line decoder block do not overlap with each other in the first direction. As such, it is convenient to achieve electrical connections of the word lines and the bit lines in the storage block, the first local bit line decoder, the second local bit line decoder, the first word line decoder, and the second word line decoder.

Meanwhile, the first local bit line decoder block, the second local bit line decoder block, the first word line decoder block, and the second word line decoder block do not overlap with each other, so that the local bit line decoder blocks and the word line decoder blocks can be disposed in the projection range of the storage array/storage block to reduce cross relationships of the electrical connections in the second chip. This is beneficial for the second chip to have a thinner thickness to achieve electrical connections with the first chip.

Since the word line decoder and/or the bit line decoder are divided into two sub-modules, the word line decoder and the bit line decoder can be disposed in the projection range of the storage array/storage block. Since the decoders are totally disposed in the projection range and the two chips are formed as a stacked structure, the decoders can be vertically connected to the storage array without extra without additional horizontal wiring connections. Therefore, there is no need to reserve wiring space between the two sub-modules. The areas of the first chip and the second chip can be further reduced.

BRIEF DESCRIPTION OF DRAWINGS

The technical solution and the beneficial effects of the present disclosure are best understood from the following detailed descriptions with reference to the accompanying drawings and embodiments.

DETAILED DESCRIPTION OF EMBODIMENTS

Figure 1:
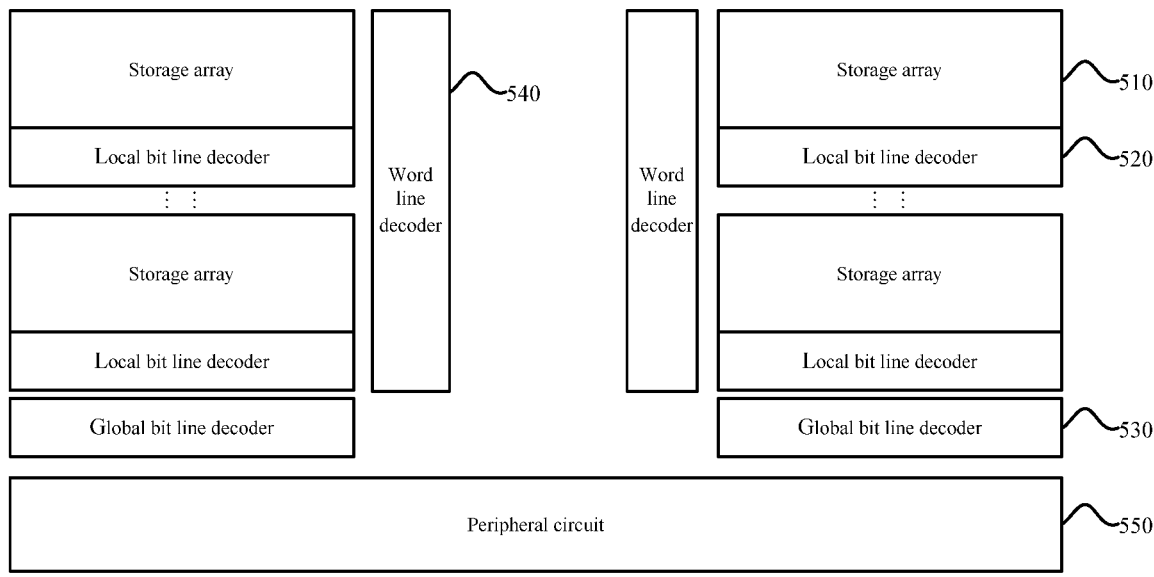
FIG. 1 illustrates an arrangement diagram of various element structures in a storage device block provided by a conventional technical solution.
Figure 2:
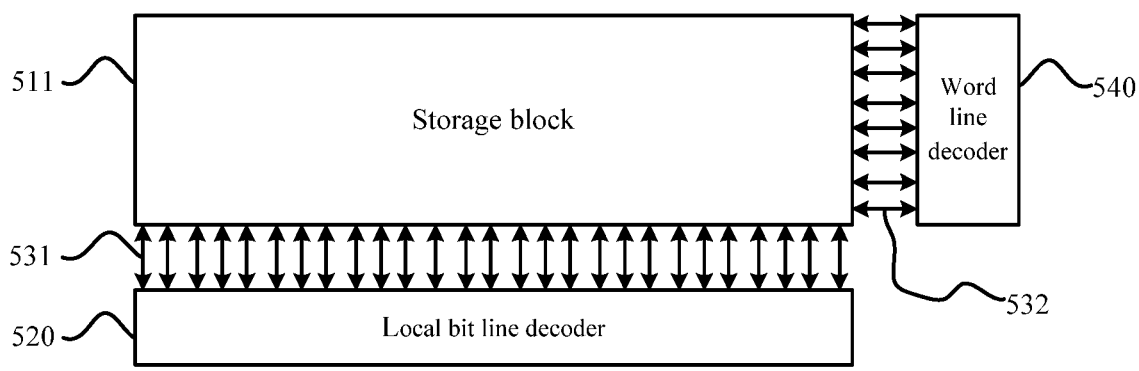
FIG. 2 illustrates another arrangement diagram of various element structures in a storage device block provided by a conventional technical solution.

The following clearly and completely describes the technical solutions in the embodiments of the present disclosure with reference to the accompanying drawings in the embodiments of the present disclosure. The described embodiments are some rather than all of the embodiments of the present disclosure. All other embodiments obtained by those skilled in the art based on the embodiments of the present disclosure without creative efforts shall fall within the protection scope of the present disclosure.

In the descriptions of the present disclosure, word line decoders are also described as X-DECs, and bit line decoders are also described as a bit line selector, a bit line multiplexer, or a Y-MUX. The word line decoders and the bit line decoders are configured to position a plurality of storage units in a storage array for further performing reading and writing operations on the storage units.

In the descriptions of the present disclosure, it should be understood that orientations or position relationships indicated by the terms "center", "longitudinal", "lateral", "length", "width", "thickness", "upper", "lower", "front", "rear", "left", "right", "vertical", "horizontal", "top", "bottom", "inside", "outside", "clockwise", and "counter-clockwise" are based on orientations or position relationships illustrated in the drawings. The terms are used to facilitate and simplify the descriptions of the present disclosure, rather than indicate or imply that the devices or elements referred to herein is required to have specific orientations or be constructed or operates in the specific orientations. Accordingly, the terms should not be construed as limiting the present disclosure. Furthermore, the terms "first" and "second" are for descriptive purposes only and should not be construed as indicating or implying relative importance or implying the number of technical features. As such, the features defined by the term "first" and "second" may include one or more of the features explicitly or implicitly. In the descriptions of the present disclosure, the term "more" refers two or more than two, unless otherwise specifically defined.

In the descriptions of the present disclosure, it should be noted that unless otherwise clearly defined and limited, the terms "mounted", "connected/coupled", and "connection" should be interoperated broadly. For example, the terms may refer to a fixed connection, a detachable connection, or an integral connection; the terms may also refer to a mechanical connection, an electrical connection, or communication with each other; the terms may further refer to a direct connection, an indirect connection through an intermediary, or an interconnection between two elements or interactive relationship between two elements. Those skilled in the art can understand the specific meanings of the above-mentioned terms in the present disclosure according to circumstances.

In the present disclosure, it should be noted that unless otherwise clearly defined and limited, a first feature "on" or "under" a second feature may mean that the first feature directly contacts the second feature, or that the first feature contacts the second feature via an additional feature there between instead of directly contacting the second feature. Moreover, the first feature "on", "above", and "over" the second feature may mean that the first feature is right over or obliquely upward over the second feature or mean that the first feature has a horizontal height higher than that of the second feature. The first feature "under", "below", and "beneath" the second feature may mean that the first feature is right beneath or obliquely downward beneath the second feature or mean that that horizontal height of the first feature is lower than that of the second feature.

Please refer to FIGS. 3 to 8. An embodiment of the present disclosure a storage device which includes a first chip 100 and a second chip 200. The second chip 200 is stacked on the first chip 100 in a third direction DR3. The first chip 100 includes a storage array 10. The storage array 10 includes at least one storage block 11, and the storage block 11 includes a plurality of word lines extending in a first direction DR1 and a plurality of bit lines extending in a second direction DR2. The second chip 200 includes a first local bit line decoder 21, a second local bit line decoder 22, a first word line decoder 31, and a second word line decoder 32 which are electrically connected to the storage block 11. The second chip 200 has a top view projection area corresponding to the storage block 11. The first local bit line decoder, the second local bit line decoder, the first word line decoder, and the second word line decoder respectively constitute, in the top view projection area, a first local bit line decoder block, a second local bit line decoder block, a first word line decoder block, and a second word line decoder block which do not overlap with each other.

It can be understood that in the storage device provided by the present embodiment, an occupied area after the first chip 100 and the second chip 200 are stacked can be reduced by constructing the first local bit line decoder block, the second local bit line decoder block, the first word line decoder block, and the second local bit line decoder block in the top view projection area, thereby reducing plane occupied space of the storage device. This is beneficial for minimizing the size of the storage device.

In the first direction DR1, a sum of a first length of the first local bit line decoder block and a second length of the second local bit line decoder block is smaller than or equal to a length of the top view projection area, and projections of the first local bit line decoder block and the second local bit line decoder block do not overlap with each other in the second direction DR2. In the second direction DR2, a sum of a third length of the first word line decoder block and a fourth length of the second word line decoder block is smaller than or equal to a width of the top view projection area, and projections of the first word line decoder block and the second word line decoder block do not overlap with each other in the first direction DR1. As such, it is convenient to achieve electrical connections of the word lines and the bit lines in the storage block 11, the first local bit line decoder 21, the second local bit line decoder 22, the first word line decoder 31, and the second word line decoder 32. In one embodiment, the first length is different from the second length, and the third length is different from the fourth length.

Meanwhile, the first local bit line decoder block, the second local bit line decoder block, the first word line decoder block, and the second word line decoder block do not overlap with each other, so that cross relationships of the electrical connections in the second chip 200 can be reduced. This is beneficial for the second chip 200 to have a thinner thickness to achieve electrical connections with the first chip 100 and to reduce delay.

In one embodiment, consecutive ones of the bit lines are electrically connected to the first local bit line decoder 21, and other consecutive ones of the bit lines are electrically connected to the second local bit line decoder 22. Consecutive ones of the word lines are electrically connected to the first word line decoder 31, and other consecutive ones of the word lines are electrically connected to the second word line decoder 32.

In one embodiment, in the first direction DR1, the first word line decoder block is located between a first edge of the top view projection area extending in the second direction DR2 and the first local bit line decoder block, and a width of the first local bit line decoder block in the second direction DR2 is smaller than the third length of the first word line decoder block in the second direction DR2. In the second direction DR2, the first word line decoder block is located between a second edge of the top view projection area extending in the first direction DR1 and the second local bit line decoder block, and the second length of the second local bit line decoder block in the first direction DR1 is larger than a width of the first word line decoder block in the first direction DR1.

In one embodiment, in the first direction DR1, the second word line decoder block is located between a third edge of the top view projection area extending in the second direction DR2 and the second local bit line decoder block, and a width of the second local bit line decoder block in the second direction DR2 is smaller than the fourth length of the second word line decoder block in the second direction DR2. In the second direction DR2, the second word line decoder block is located between a fourth edge of the top view projection area extending in the first direction DR1 and the first local bit line decoder block, and the first length of the first local bit line decoder block in the first direction DR1 is larger than a width of the second word line decoder block in the first direction DR1.

In one embodiment, each of the first local bit line decoder 21 and the second local bit line decoder 22 has a plurality of first transmission terminals, and each of the first transmission terminals is electrically connected to one of the bit lines through a first silicon via or a pair of first bonding pads.

In one embodiment, each of the first word line decoder 31 and the second word line decoder 32 has a plurality of second transmission terminals, and each of the second transmission terminals is electrically connected to one of the word lines through a second silicon via or a pair of second bonding pads.

Each of the transmission terminals can be, but is not limited to, a metal pad, for example, a copper pad or a metal block.

It should be noted that the first edge can be one of an edge at the left side of the top view projection area and an edge at the right side of the top view projection area, and the third edge can be the other one of the edge at the left side of the top view projection area and the edge at the right side of the top view projection area. The second edge can be one of an edge at a lower side of the top view projection area and an edge at an upper side of the top view projection area, and the fourth edge can be the other one of the edge at the lower side of the top view projection area and the edge at the upper side of the top view projection area.

In one embodiment, the first chip 100 and the second chip 200 are electrically connected by a bonding structure, and the bonding structure includes a first bonding layer located on the first chip 100 and a second bonding layer located on the second chip 200.

Specifically, the first chip includes a first bonding layer, and the first bonding layer includes at least one first bonding pad and/or at least one second bonding pad. The second chip includes a second bonding layer, and the second bonding layer includes at least one first bonding pad and/or at least one second bonding pad. The first bonding pad located on the first bonding layer is bonded to the first bonding pad located on the second bonding layer, and/or, the second bonding pad located on the first bonding layer is bonded to the second bonding pad located on the second bonding layer.

It should be noted that, in the present embodiment, a required electrical connection between the first chip 100 and the second chip 200 can be achieved through the bonding structure. Specifically, the specific bonding process can be achieved by the conventional technology and is not repeated herein.

Figure 3:
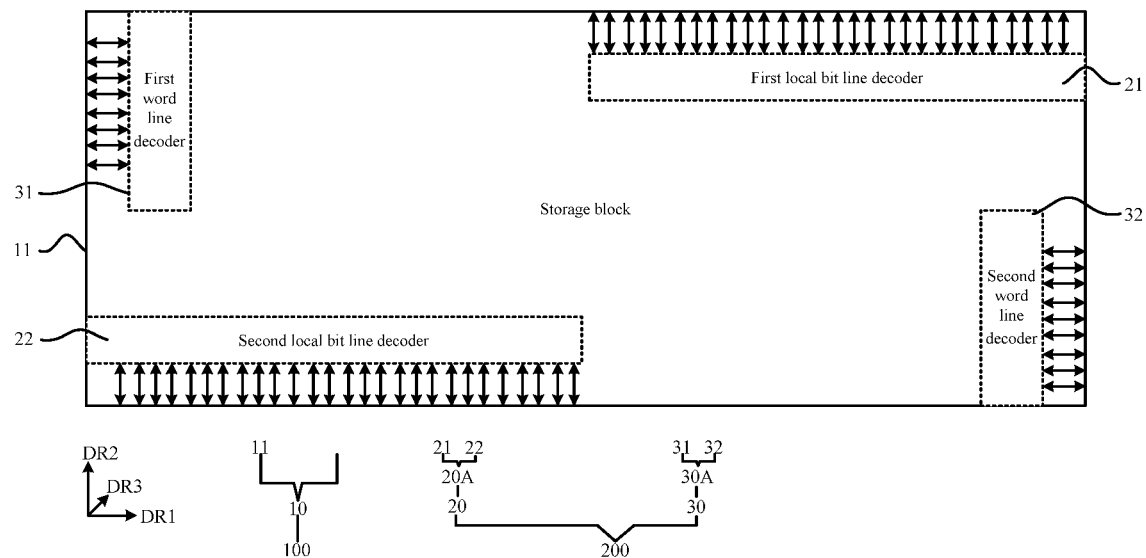
FIG. 3 illustrates a first structure diagram of a storage device provided by an embodiment of the present disclosure.

As shown in FIG. 3, an embodiment of the present disclosure a storage device which includes a first chip 100 and a second chip 200. The first chip 100 includes a storage array 10. The storage array 10 includes at least one storage block 11, and an area where one of the at least one storage block 11 is located is a top view projection area. The second chip 200 includes a logic control circuit. The logic control circuit includes a first local bit line decoder 21 and a second local bit line decoder 22. The one storage block 11 is electrically connected to the first local bit line decoder 21 and the second local bit line decoder 22. A first local bit line decoder block constituted by the first local bit line decoder 21 at least partially overlaps with the top view projection area, and a second local bit line decoder block constituted by the second local bit line decoder 22 at least partially overlaps with the top view projection area. The first local bit line decoder block and the second local bit line decoder block are disposed at diagonal positions in a first diagonal line.

It can be understood that in the storage device provided by the present embodiment, an occupied area after first chip 100 and the second chip 200 are stacked can be reduced by partially overlapping the top view projection area constituted by the one storage block 11 with the first local bit line decoder block and the second local bit line decoder block, thereby reducing occupied space of the storage device. This is beneficial for minimizing the size of the storage device. Furthermore, when the first local bit line decoder block and the second local bit line decoder block are located at relative positions of the first diagonal line, it is convenient for the one storage block 11 to achieve the electrically connections with the first local bit line decoder 21 and the second local bit line decoder 22.

The storage device can be, but is not limited to, a NOR Flash, and can also be other types of storage chips.

It should be noted that each structure area and/or each sub-structure area can be, but is not limited to, a rectangle, a regular polygon, or other shapes such as a circle.

The logic control circuit includes a local bit line decoder 20. The local bit line decoder 20 includes a first local bit line sub-decoder 20A. The first local bit line sub-decoder 20A includes the first local bit line decoder 21 and the second local bit line decoder 22. Each of the at least one storage block 11 can be configured with a corresponding local bit line sub-decoder.

In one embodiment, one of the at least one storage block 11 includes a plurality of bit lines. A part of the bit lines are electrically connected to the first local bit line decoder 21, and the other part of the bit lines are electrically connected to the second local bit line decoder 21.

It should be noted that the bit lines can be arranged in a first direction DR1.

In one embodiment, the one of the at least one storage block 11 further includes a plurality of word lines. A part of the word lines are electrically connected to a first word line decoder 31, and the other part of the word lines are electrically connected to a second word line decoder 32.

It should be noted that the word lines can be arranged in a second direction DR2.

In one embodiment, a thickness direction of the first chip 100 and the second chip 200 which are stacked can be defined as a third direction DR3.

Figure 4:
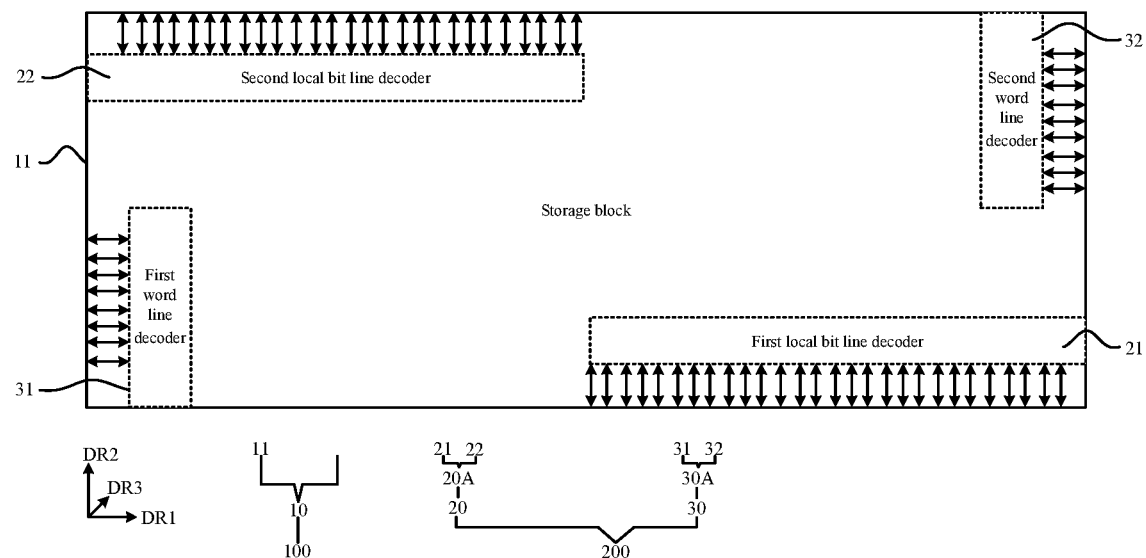
FIG. 4 illustrates a second structure diagram of a storage device provided by an embodiment of the present disclosure.

As shown in FIGS. 3 and 4, in one embodiment, the first local bit line decoder block at least partially overlaps with a first top right structure area of the top view projection area or a first bottom right structure area of the top view projection area. When the first local bit line decoder block at least partially overlaps with the first top right structure area of the top view projection area, the second local bit line decoder block at least partially overlaps with the first bottom left structure area of the top view projection area. When the first local bit line decoder block at least partially overlaps with the first bottom right structure area of the top view projection area, the second local bit line decoder block at least partially overlaps with the first top left structure area of the top view projection area.

In one embodiment, the first local bit line decoder block at least partially overlaps with the first top left structure area of the top view projection area or the first bottom left structure area of the top view projection area. When the first local bit line decoder block at least partially overlaps with the first top left structure area of the top view projection area, the second local bit line decoder block at least partially overlaps with the first bottom right structure area of the top view projection area. When the first local bit line decoder block at least partially overlaps with the first bottom left structure area of the top view projection area, the second local bit line decoder block at least partially overlaps with the first top right structure area of the top view projection area.

In one embodiment, the logic control circuit further includes the first word line decoder 31 and the second word line decoder 32. The one storage block 11 is electrically connected to the first word line decoder 31 and the second word line decoder 32. A first word line decoder block constituted by the first word line decoder 31 at least partially overlaps with the top view projection area, and a second word line decoder block constituted by the second word line decoder 32 at least partially overlaps with the top view projection area. The first word line decoder block and the second word line decoder block are disposed at diagonal positions in a second diagonal line. The second diagonal line is different from the first diagonal line.

It should be noted that the logic control circuit includes a word line decoder 30. The word line decoder 30 includes a first word line sub-decoder 30A. The first word line sub-decoder 30A includes the first word line decoder 31 and the second word line decoder 32. Each of the at least one storage block 11 can be configured with a corresponding word line sub-decoder.

As shown in FIGS. 3 and 4, in one embodiment, the first word line decoder block at least partially overlaps with a second top left structure area of the top view projection area or a second bottom left structure area of the top view projection area. When the word line decoder block at least partially overlaps with the second top left structure area of the top view projection area, the second word line decoder block at least partially overlaps with the second bottom right structure area of the top view projection area. When the first word line decoder block at least partially overlaps with the second bottom left structure area of the top view projection area, the second word line decoder block at least partially overlaps with the second top right structure area of the top view projection area.

In one embodiment, the first word line decoder block at least partially overlaps with the second top right structure area of the top view projection area or the second bottom right structure area of the top view projection area. When the first word line decoder block at least partially overlaps with the second top right structure area of the top view projection area, the second word line decoder block at least partially overlaps with the second bottom left structure area of the top view projection area. When the first word line decoder block at least partially overlaps with the second bottom right structure area of the top view projection area, the second word line decoder block at least partially overlaps with the second top left structure area of the top view projection area.

As shown in FIGS. 3 and 4, in one embodiment, the present embodiment provides a storage device which includes a first chip 100 and a second chip 200. The first chip 100 includes at least one storage array 10, and an area where one of the at least one storage block 11 is located is a top view projection area. The second chip 200 includes a logic control circuit, and the logic control circuit includes a first word line decoder 31 and a second word line decoder 32. One of the at least one storage block 11 is electrically connected to the first word line decoder 31 and the second word line decoder 32. A first word line decoder block constituted by the first word line decoder 31 at least partially overlaps with the top view projection area, and the second word line decoder block constituted by the second word line decoder 32 at least partially overlaps with the top view projection area. The first word line decoder block and the second word line decoder block are disposed at diagonal positions in a second diagonal line.

It can be understood that the storage device provided by the present embodiment, an occupied area after first chip 100 and the second chip 200 are stacked can be reduced by partially overlapping the top view projection area constituted by the one storage block 11 with the first word line decoder block and the second word line decoder block, thereby reducing occupied space of the storage device. This is beneficial for minimizing the size of the storage device. Furthermore, when the first word line decoder block and the second word decoder block are located at relative positions of the second diagonal line, it is convenient for the one storage block 11 to achieve the electrically connections with the first word line decoder 31 and the second local word line decoder 22.

In one embodiment, the logic control circuit further includes a first local bit line decoder 21 and a second local bit line decoder 22. The one storage block 11 is electrically connected to the first local bit line decoder 21 and the second local bit line decoder 21. A first local bit line decoder block constituted by the first local bit line decoder 21 at least partially overlaps with the top view projection area, and a second local bit line decoder block constituted by the second local bit line decoder 22 at least partially overlaps with the top view projection area. The first local bit line decoder block and the second local bit line decoder block are disposed at diagonal positions in a first diagonal line. The first diagonal line is different from the second diagonal line.

Specifically, the top view projection area can be a rectangle. The first local bit line decoder block is located at one of a first right angle of the top view projection area, and a third right angle of the top view projection area, and the second local bit line decoder block is located at the other one of the first right angle of the top view projection area and the third right angle of the top view projection area. The first word line decoder block is located at one of a second right angle of the top view projection area and a fourth right angle of the top view projection area, and the second word line decoder area is located at the other one of the second right angle of the top view projection area and the fourth right angle of the top view projection area. Alternatively, the first local bit line decoder block is located at one of the second right angle of the top view projection area and the fourth right angle of the top view projection area, and the second local bit line decoder block is located at the other one of the second right angle of the top view projection area and the fourth right angle of the top view projection area. The first word line decoder block is located at one of the first right angle of the top view projection area and the third right angle of the top view projection area, and the second word line decoder area is located at the other one of the first right angle of the top view projection area and the third right angle of the top view projection area. The first right angle and the third right angle are respectively located at two sides in one diagonal line of the top view projection area, and the second right angle and the fourth right angle are respectively located at two sides in the other diagonal line of the top view projection area.

In one embodiment, the first word line decoder 31 and the second word line decoder 32 can exchange their respective sub-structure areas.

In one embodiment, the first local bit line decoder 21 and the second local bit line decoder 22 can also exchange their respective sub-structure areas.

Figure 5:
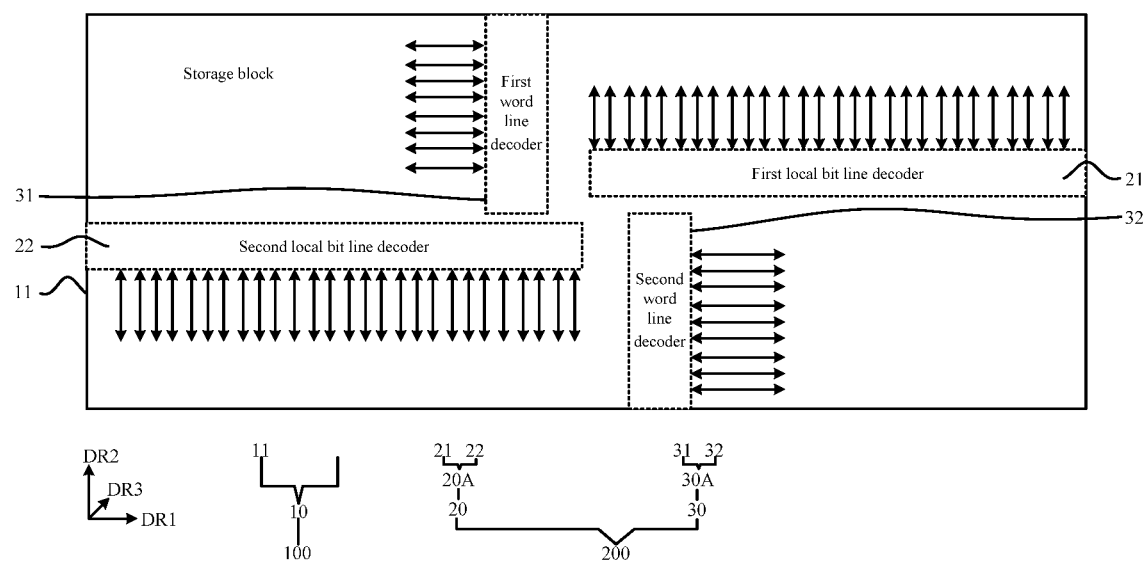
FIG. 5 illustrates a third structure diagram of a storage device provided by an embodiment of the present disclosure.

As shown in FIG. 5, in one embodiment, positions of the first word line decoder block and the second word line decoder block can be flexibly set in the first direction DR1. For example, the first word line decoder block can be located between a left side of the second local bit line decoder block and a left side of the first local bit line decoder block in the first direction DR1. For example, the first word line decoder block can be adjacent to the first local bit line decoder block. Similarly, the second word line decoder block can be located between a right side of the first local bit line decoder block and a right side of the second local bit line decoder block in the first direction DR1. For example, the second word line decoder block can be adjacent to the second local bit line decoder block.

Positions of the first local bit line decoder block and the second local bit line decoder block can be flexibly set in the second direction DR2. For example, the first local bit line decoder block can be located between an upper side of the first word line decoder block and an upper side of the second word line decoder block in the second direction DR2. For example, the first local bit line decoder block can be adjacent to the second word line decoder block. Similarly, the second local bit line decoder block can be located between a lower side of the second word line decoder block and a lower side of the first word line decoder block in the second direction DR2. For example, the second local bit line decoder block can be adjacent to the first word line decoder block.

Figure 6:
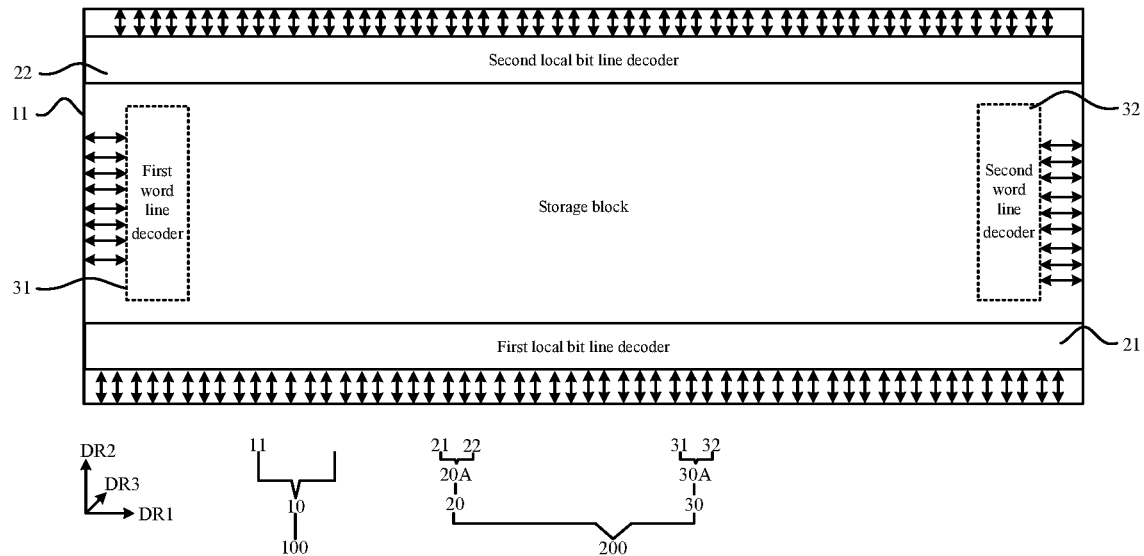
FIG. 6 illustrates a fourth structure diagram of a storage device provided by an embodiment of the present disclosure.

As shown in FIG. 6, in one embodiment, in the first direction DR1, a length of the first local bit line decoder block and a length of the second local bit line decoder block are smaller than or equal to a length of the top view projection area. In the second direction DR2, the first word line decoder block is located between the first local bit line decoder block and the second local bit line decoder block, and the second word line decoder block is located between the first local bit line decoder block and the second local bit line decoder block.

Figure 7:
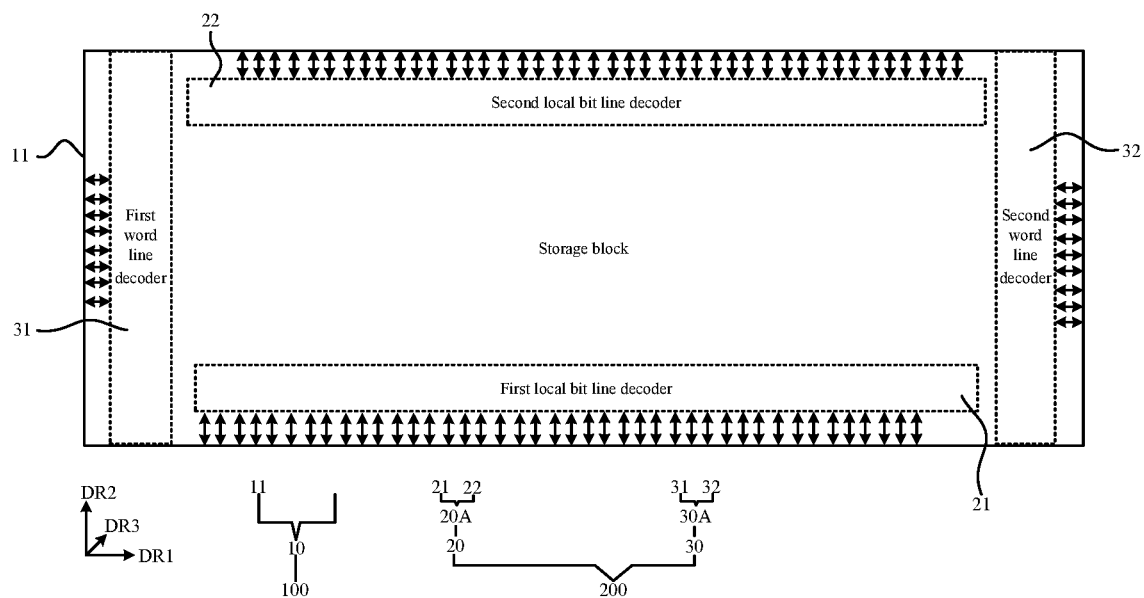
FIG. 7 illustrates a fifth structure diagram of a storage device provided by an embodiment of the present disclosure.

As shown in FIG. 7, in one embodiment, in the second direction DR2, a length of the first word line decoder block and a length of the second word line decoder block are smaller than or equal to a width of the top view projection. In the first direction DR1, the first local bit line decoder block is located between the first word line decoder block and the second word line decoder block, and the second local bit line decoder block is located between the first word line decoder block and the second word line decoder block.

Figure 8:
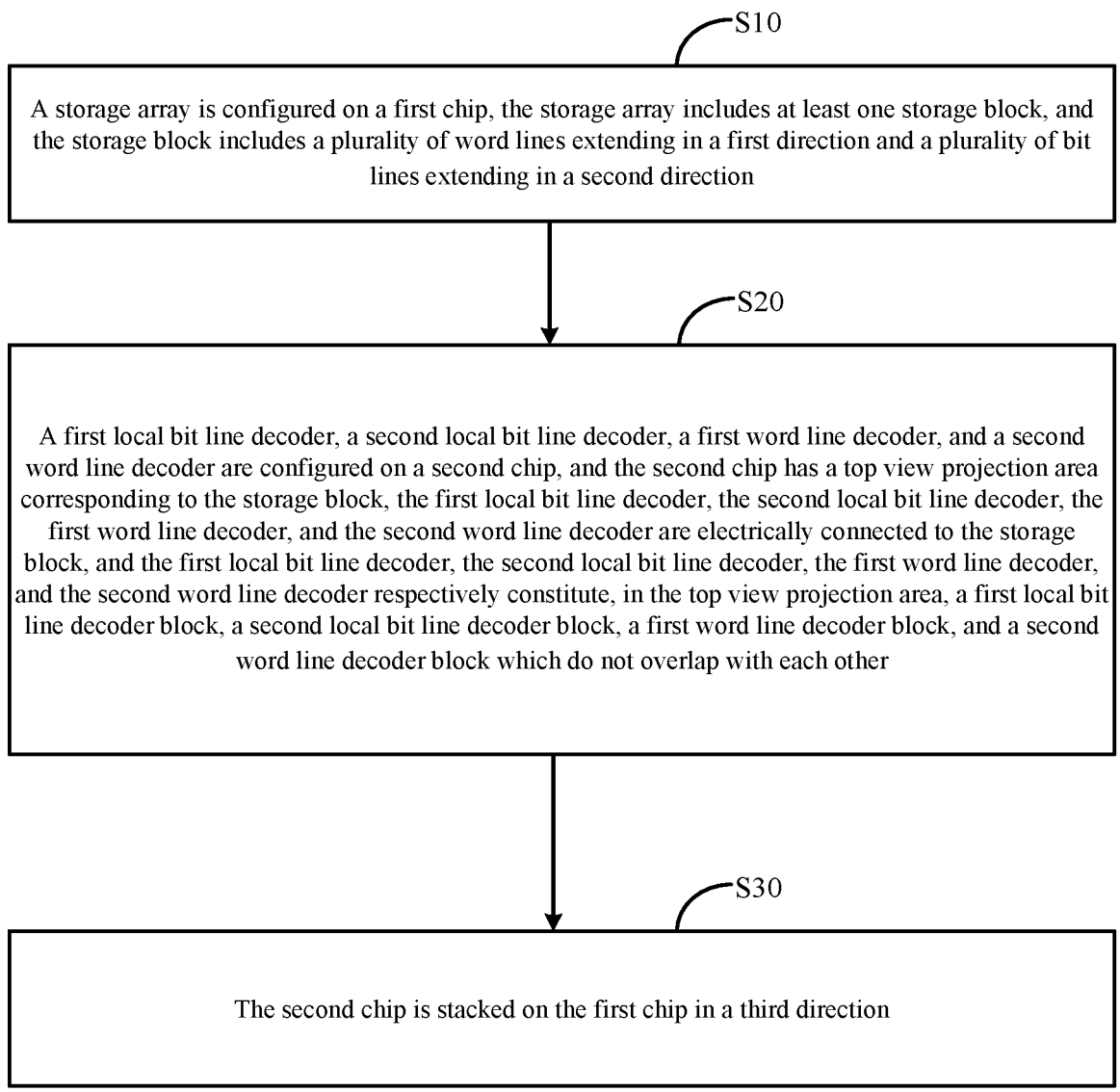
FIG. 8 illustrates a flowchart of a manufacturing method of a storage device provided by an embodiment of the present disclosure.

As shown in FIG. 8, in one embodiment, the present embodiment provides a manufacturing method of a storage device which includes the following steps.

In step S10, a storage array is configured on a first chip, the storage array includes at least one storage block, and the storage block includes a plurality of word lines extending in a first direction and a plurality of bit lines extending in a second direction.

In step S20, a first local bit line decoder, a second local bit line decoder, a first word line decoder, and a second word line decoder are configured on a second chip, and the second chip has a top view projection area corresponding to the storage block, the first local bit line decoder, the second local bit line decoder, the first word line decoder, and the second word line decoder are electrically connected to the storage block, and the first local bit line decoder, the second local bit line decoder, the first word line decoder, and the second word line decoder respectively constitute, in the top view projection area, a first local bit line decoder block, a second local bit line decoder block, a first word line decoder block, and a second word line decoder block which do not overlap with each other.

In step S30, the second chip is stacked on the first chip in a third direction.

It can be understood that in the manufacturing method provided by the present embodiment, an occupied area after the first chip 100 and the second chip 200 are stacked can be reduced by constructing the first local bit line decoder block, the second local bit line decoder block, the first word line decoder block, and the second local bit line decoder block in the top view projection area, thereby reducing plane occupied space of the storage device. This is beneficial for minimizing the size of the storage device.

Furthermore, in the first direction DR1, a sum of a first length of the first local bit line decoder block and a second length of the second local bit line decoder block is smaller than or equal to a length of the top view projection area, and projections of the first local bit line decoder block and the second local bit line decoder block do not overlap with each other in the second direction DR2. In the second direction DR2, a sum of a third length of the first word line decoder block and a fourth length of the second word line decoder block is smaller than or equal to a width of the top view projection area, and projections of the first word line decoder block and the second word line decoder block do not overlap with each other in the first direction DR1. As such, it is convenient to achieve electrical connections of the word lines and the bit lines in the storage block 11, the first local bit line decoder 21, the second local bit line decoder 22, the first word line decoder 31, and the second word line decoder 32.

Meanwhile, the first local bit line decoder block, the second local bit line decoder block, the first word line decoder block, and the second word line decoder block do not overlap with each other, so that cross relationships of the electrical connections in the second chip 200 can be reduced. This is beneficial for the second chip 200 to have a thinner thickness to achieve electrical connections with the first chip 100 and to reduce delay.

In one embodiment, the manufacturing method further includes: electrically connecting consecutive ones of the bit lines with the first local bit line decoder 21; electrically connecting other consecutive ones of the bit lines with the second local bit line decoder; electrically connecting consecutive ones of the word lines with the first word line decoder 31; and electrically connecting other consecutive ones of the word lines with the second word line decoder 32.

In one embodiment, the manufacturing method further includes: configuring a first bonding layer on the first chip 100; configuring a second bonding layer on the second chip 200; and stacking the second chip 200 on the first chip 100, and forming a bonding structure through the first bonding layer and the second bonding layer to electrically connect the first chip 100 with the second chip 200.

In one embodiment, the present embodiment provides a manufacturing method of a storage device which includes the following steps.

A storage array 10 is configured on the first chip 100, the storage array 10 includes at least one storage block 11, and an area where one of the at least one storage block 11 is located is a top view projection area.

A logic control circuit is configured on the second chip 200. The logic control circuit includes a first local bit line decoder 21 and a second local bit line decoder 22. An area where the first local bit line decoder 21 is located is a first local bit line decoder block, and an area where the second local bit line decoder 22 is located is a second local bit line decoder block.

The first local bit line decoder block is partially stacked on a top right area of the top view projection area, and/or, and the second local bit line decoder block is partially stacked on a bottom left are of the top view projection area. The first local bit line decoder block and the second local bit line decoder block are disposed at diagonal positions in a first diagonal line.

It can be understood that in the manufacturing method provided by the present embodiment, an occupied area after first chip 100 and the second chip 200 are stacked can be reduced by partially overlapping the top view projection area constituted by the one storage block 11 with the first local bit line decoder block and the second local bit line decoder block, thereby reducing occupied space of the storage device. This is beneficial for minimizing the size of the storage device. Furthermore, when the first local bit line decoder block and the second local bit line decoder block are located at relative positions of the first diagonal line, it is convenient for the one storage block 11 to achieve the electrically connections with the first local bit line decoder 21 and the second local bit line decoder 22.

In one embodiment, the manufacturing method further includes: configuring a plurality of bit lines in one of the at least one block 11; configuring a part of the bit lines to be electrically connected to the first local bit line decoder 21; and configuring the other part of the bit lines to be electrically connected to the second local bit line decoder 22.

In one embodiment, the manufacturing method further includes: configuring a first word line decoder 31 and a second word line decoder 32 in the logic control circuit, wherein an area where the first word line decoder 31 is located is a first word line decoder block, and an area where the second word line decoder 32 is located is a second word line decoder block; and partially stacking the first word line decoder block on a top left area of the top view projection area, and/or, partially stacking the second word line decoder block on a bottom right area of the top view projection area. The first word line decoder block and the second word line decoder block are disposed at diagonal positions in a second diagonal line. The second diagonal line is different from the first diagonal.

It should be noted that projections of the first word line decoder block and the second word line decoder block do not overlap with each other in the first direction DR1. It means that in the first direction DR1, the first word line decoder block can have a projection of the first word line decoder block, and the second word line decoder block can have a projection of the second word line decoder. Furthermore, in the first direction DR1, the projection of the first word line decoder block and the projection of the second word line decoder block do not overlap with each other on any one plane perpendicular to the first direction DR1.

Projections of the first local bit line decoder block and the second local bit line decoder block do not overlap with each other in the second direction DR2. It means that in the second direction DR2, the first local bit line decoder block can have a projection of the first local bit line decoder block, and the second local bit line decoder block can have a projection of the second local bit. Furthermore, in the second direction DR2, the projection of the first local bit line decoder block and the projection of the second local bit line decoder block do not overlap with each other on any one plane perpendicular to the second direction DR2.

In the above-mentioned embodiments, descriptions for the embodiments emphasize different aspects, and for a part without being described in detail in a certain embodiment, reference may be made to related descriptions in other embodiments.

The storage device and the manufacturing method thereof provided by the embodiments of the present disclosure are described in detail above. Specific examples are used in the specification to explain the principles and implementation manners of the present disclosure. The descriptions of the above-mentioned embodiments are only used to facilitate understanding of the technical solutions and core ideas of the present disclosure. Those skilled in the art should understand that they may still make modifications to the technical solutions described in the above-mentioned embodiments or make equivalent replacements to some technical features thereof. These modifications or equivalent replacements do not depart from the spirit and scope of the technical solutions of the embodiments of the present disclosure.

What is claimed is:

1. A storage device, comprising:
a first chip, the first chip comprising a storage array, the storage array comprising at least one storage block, and the storage block comprising a plurality of word lines extending in a first direction and a plurality of bit lines extending in a second direction; and
a second chip stacked on the first chip in a third direction, the second chip comprising a first local bit line decoder, a second local bit line decoder, a first word line decoder, and a second word line decoder which are electrically connected to the storage block, the second chip having a top view projection area corresponding to the storage block, and the first local bit line decoder, the second local bit line decoder, the first word line decoder, and the second word line decoder respectively constituting, in the top view projection area, a first local bit line decoder block, a second local bit line decoder block, a first word line decoder block, and a second word line decoder block which do not overlap with each other.

2. The storage device of claim 1, wherein in the first direction, a sum of a first length of the first local bit line decoder block and a second length of the second local bit line decoder block is smaller than or equal to a length of the top view projection area, and projections of the first local bit line decoder block and the second local bit line decoder block do not overlap with each other in the second direction; and
in the second direction, a sum of a third length of the first word line decoder block and a fourth length of the second word line decoder block is smaller than or equal to a width of the top view projection area, and projections of the first word line decoder block and the second word line decoder block do not overlap with each other in the first direction.

3. The storage device of claim 2, wherein the first length is different from the second length, and the third length is different from the fourth length.

4. The storage device of claim 2, wherein a part of the bit lines are electrically connected to the first local bit line decoder, and the other part of the bit lines are electrically connected to the second local bit line decoder; and
a part of the word lines are electrically connected to a first word line decoder, and the other part of the word lines are electrically connected to a second word line decoder.

5. The storage device of claim 2, wherein in the first direction, the first word line decoder block is located between a first edge of the top view projection area extending in the second direction and the first local bit line decoder block, and a width of the first local bit line decoder block in the second direction is smaller than the third length of the first word line decoder block in the second direction; and
in the second direction, the first word line decoder block is located between a second edge of the top view projection area extending in the first direction and the second local bit line decoder block, and the second length of the second local bit line decoder block in the first direction is larger than a width of the first word line decoder block in the first direction.

6. The storage device of claim 5, wherein in the first direction, the second word line decoder block is located between a third edge of the top view projection area extending in the second direction and the second local bit line decoder block, and a width of the second local bit line decoder block in the second direction is smaller than the fourth length of the second word line decoder block in the second direction; and
in the second direction, the second word line decoder block is located between a fourth edge of the top view projection area extending in the first direction and the first local bit line decoder block, and the first length of the first local bit line decoder block in the first direction is larger than a width of the second word line decoder block in the first direction.

7. The storage device of claim 4, wherein each of the first local bit line decoder and the second local bit line decoder has a plurality of first transmission terminals, and each of the first transmission terminals is electrically connected to one of the bit lines through a first silicon via or a pair of first bonding pads.

8. The storage device of claim 7, wherein each of the first word line decoder and the second word line decoder has a plurality of second transmission terminals, and each of the second transmission terminals is electrically connected to one of the word lines through a second silicon via or a pair of second bonding pads.

9. The storage device of claim 7, wherein the first chip comprises a first bonding layer, and the first bonding layer comprises at least one first bonding pad and/or at least one second bonding pad;

the second chip comprises a second bonding layer, and the second bonding layer comprises at least one first bonding pad and/or at least one second bonding pad; and the first bonding pad located on the first bonding layer is bonded to the first bonding pad located on the second bonding layer, and/or, the second bonding pad located on the first bonding layer is bonded to the second bonding pad located on the second bonding layer.

10. The storage device of claim 1, wherein the top view projection area is a rectangle, the first local bit line decoder block is located at one of a first right angle of the top view projection area and a third right angle of the top view projection area, and the second local bit line decoder block is located at the other one of the first right angle of the top view projection area and the third right angle of the top view projection area; the first word line decoder block is located at one of a second right angle of the top view projection area and a fourth right angle of the top view projection area, and the second word line decoder area is located at the other one of the second right angle of the top view projection area and the fourth right angle of the top view projection area; or the first local bit line decoder block is located at one of the second right angle of the top view projection area and the fourth right angle of the top view projection area, and the second local bit line decoder block is located at the other one of the second right angle of the top view projection area and the fourth right angle of the top view projection area; the first word line decoder block is located at one of the first right angle of the top view projection area and the third right angle of the top view projection area, and the second word line decoder area is located at the other one of the first right angle of the top view projection area and the third right angle of the top view projection area;

wherein the first right angle and the third right angle are respectively located at two sides in one diagonal line of the top view projection area, and the second right angle and the fourth right angle are respectively located at two sides in the other diagonal line of the top view projection area.

11. The storage device of claim 1, wherein in the first direction, the first word line decoder block is located between a left side of the second local bit line decoder block and a left side of the first local bit line decoder block; and in the first direction, the second word line decoder block is located between a right side of the first local bit line decoder block and a right side of the second local bit line decoder block.

12. The storage device of claim 1, wherein in the second direction, the first local bit line decoder block is located between an upper side of the first word line decoder block and an upper side of the second word line decoder block; and in the second direction, the second local bit line decoder block is located between a lower side of the second word line decoder block and a lower side of the first word line decoder block.

13. The storage device of claim 1, wherein in the first direction, a length of the first local bit line decoder block and a length of the second local bit line decoder block are smaller than or equal to a length of the top view projection area; and in the second direction, the first word line decoder block is located between the first local bit line decoder block and the second local bit line decoder block, and the second word line decoder block is located between the first local bit line decoder block and the second local bit line decoder block.

14. The storage device of claim 1, wherein in the second direction, a length of the first word line decoder block and a length of the second word line decoder block are smaller than or equal to a width of the top view projection; and in the first direction, the first local bit line decoder block is located between the first word line decoder block and the second word line decoder block, and the second local bit line decoder block is located between the first word line decoder block and the second word line decoder block.

15. A manufacturing method of a storage device, comprising:

configuring a storage array on a first chip, wherein the storage array comprises at least one storage block, and the storage block comprises a plurality of word lines extending in a first direction and a plurality of bit lines extending in a second direction;

configuring a first local bit line decoder, a second local bit line decoder, a first word line decoder, and a second word line decoder on a second chip, wherein the second chip has a top view projection area corresponding to the storage block, the first local bit line decoder, the second local bit line decoder, the first word line decoder, and the second word line decoder are electrically connected to the storage block, and the first local bit line decoder, the second local bit line decoder, the first word line decoder, and the second word line decoder respectively constitute, in the top view projection area, a first local bit line decoder block, a second local bit line decoder block, a first word line decoder block, and a second word line decoder block which do not overlap with each other; and stacking the second chip on the first chip in a third direction.

16. The manufacturing method of claim 15, further comprising:

in the first direction, configuring a sum of a first length of the first local bit line decoder block and a second length of the second local bit line decoder block to be smaller than or equal to a length of the top view projection area, wherein projections of the first local bit line decoder block and the second local bit line decoder block do not overlap with each other in the second direction; and in the second direction, configuring a sum of a third length of the first word line decoder block and a fourth length of the second word line decoder block to be smaller than or equal to a width of the top view projection area, wherein projections of the first word line decoder block and the second word line decoder block do not overlap with each other in the first direction.

17. The manufacturing method of claim 16, further comprising:

electrically connecting a part of the bit lines with the first local bit line decoder;

electrically connecting the other part of the bit lines with the second local bit line decoder;

electrically connecting a part of the word lines with the first word line decoder; and electrically connecting the other part of the word lines with the second word line decoder.

18. The manufacturing method of claim 17, further comprising:
configuring a first bonding layer on the first chip;
configuring a second bonding layer on the second chip; and
stacking the second chip on the first chip, and forming a bonding structure through the first bonding layer and the second bonding layer to electrically connect the first chip with the second chip.

19. A storage device, comprising:
a first chip, the first chip comprising a storage array, the storage array comprising at least one storage block, and the storage block comprising a plurality of word lines extending in a first direction and a plurality of bit lines extending in a second direction; and
a second chip stacked on the first chip in a third direction, the second chip comprising at least two local bit line decoders and at least two word line decoders which are electrically connected to the storage block, the second chip having a top view projection area corresponding to the storage block, each of the at least two local bit line decoders constituting, in the top view projection area, a local bit line decoder block, and each of the at least two word line decoders constituting, in the top view projection area, a word line decoder block, and the local bit line decoder blocks constituted by the at least two local bit line decoders and the word line decoder blocks constituted by the at least two word line decoders do not overlap with each other.

20. The storage device of claim 19, wherein in the first direction, a sum of lengths of the at least two local bit line decoder block is smaller than or equal to a length of the top view projection area, and projections of the at least two local bit line decoder blocks do not overlap with each other in the second direction; and
in the second direction, a sum of lengths of the at least two word line decoder blocks is smaller than or equal to a width of the top view projection area, and projections of the at least two word line decoder blocks do not overlap with each other in the first direction.

* * * * *